United States Patent [19]

Hansen et al.

[11] 3,999,280
[45] Dec. 28, 1976

[54] NARROW LEAD CONTACT FOR AUTOMATIC FACE DOWN BONDING OF ELECTRONIC CHIPS

[75] Inventors: Niels Junior Hansen, Camp Hill; Ronald James Capp, Mechanicsburg, both of Pa.

[73] Assignee: AMP Incorporated, Harrisburg, Pa.

[22] Filed: Oct. 1, 1975

[21] Appl. No.: 618,667

Related U.S. Application Data

[60] Division of Ser. No. 465,383, April 29, 1974, Pat. No. 3,938,177, and a continuation-in-part of Ser. No. 373,227, June 25, 1973, abandoned.

[52] U.S. Cl. .............................. 29/569 L; 29/577; 29/588; 29/589; 29/591
[51] Int. Cl.² .......................................... B01J 17/00
[58] Field of Search ................ 29/569 L, 588, 589, 29/591, 577, 577 IC; 357/17

[56] References Cited

UNITED STATES PATENTS

| 3,544,857 | 12/1970 | Byrne | 29/588 |
|---|---|---|---|
| 3,553,830 | 1/1971 | Jenny | 29/577 IC |
| 3,821,775 | 6/1974 | Biard | 357/17 |
| 3,875,456 | 4/1975 | Kano | 357/17 |

Primary Examiner—W. Tupman
Attorney, Agent, or Firm—Russell J. Egan

[57] ABSTRACT

A narrow lead contact is disclosed for face down bonding of electronic chips, such as light emitting diodes. The narrow lead and the circuitry associated with the chip or diode is formed on a thin film of transparent insulating material in a conventional manner. The chip is placed face down on the lead on the film and bonded thereto. The bonding can be accomplished by known methods including solder reflow or conductive epoxys. A second lead, which may include a reflector in the case of a light emitting diode, is attached to another point on the chip. When the chip is a light emitting diode, the chip assembly can be encapsulated in a lens system which is attached to both sides of the film. Most of the light emitted from the back and sides of the diode is thus passed out through the film and lens system since the thin lead will preferably obscure less than 35% of the face of the diode. The circuitry formed on the thin film may contain an adjustable resistance to compensate for variations in light intensity. A base circuit, on either rigid or flexible support material, may include whatever circuitry is necessary to enable any specific chip in response to any desired criteria.

7 Claims, 10 Drawing Figures

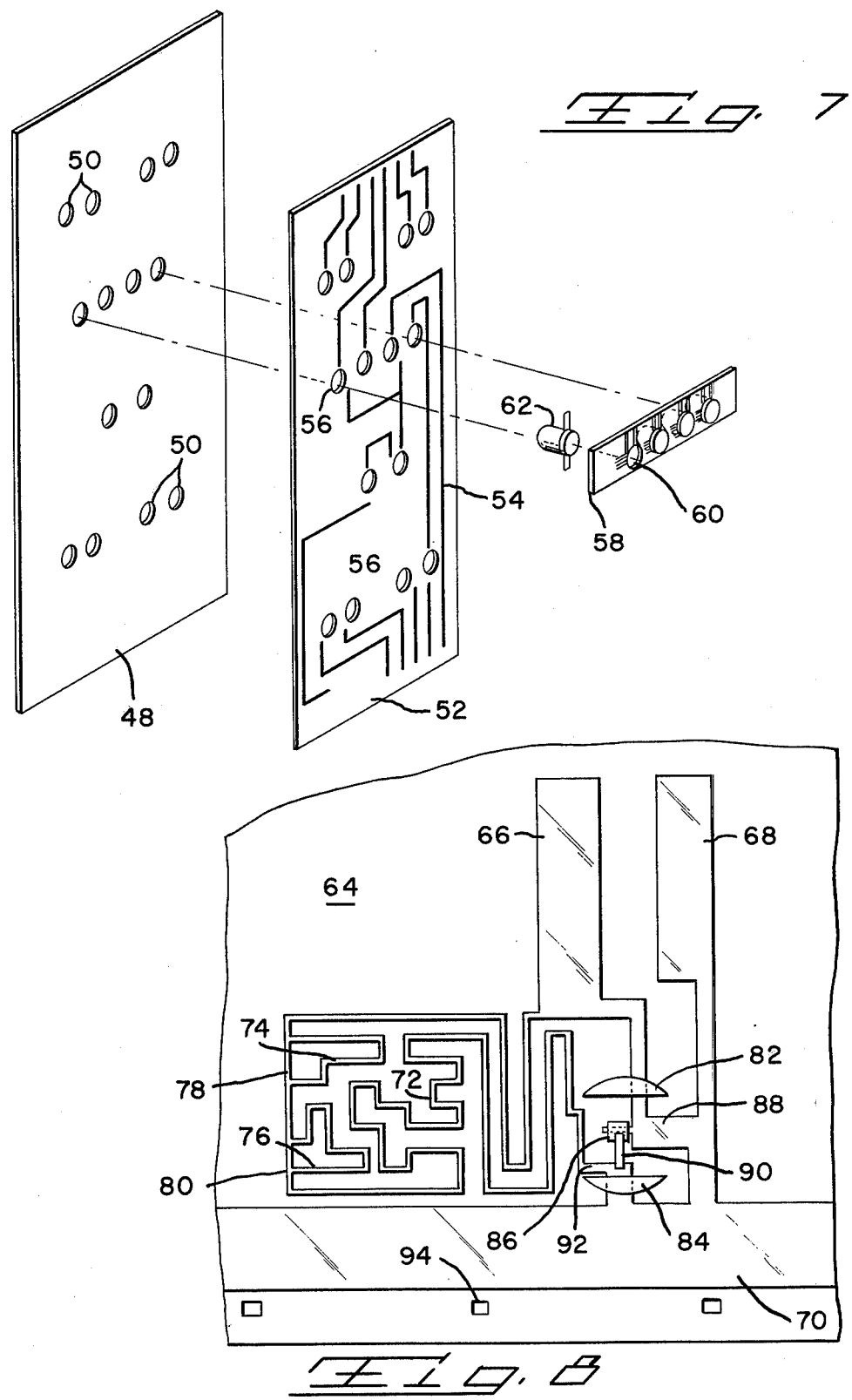

NARROW LEAD CONTACT FOR AUTOMATIC FACE DOWN BONDING OF ELECTRONIC CHIPS

CROSS REFERENCE TO RELATED APPLICATIONS

The present application is a continuation-in-part of our application Ser. No. 373,227 filed June 25, 1973, now abandoned, and a continuation, division, of application Ser. No. 465,383, filed April 29, 1974, now U.S. Pat. No. 3,938,177.

BACKGROUND OF THE INVENTION

1. The Field Of The Invention

The present invention concerns an improved narrow lead contact for electronic chips, such as light emitting diodes and, in particular, a method for fabricating such a narrow lead and incorporating it into associated electronic devices.

2. The Prior Art

The conventional methods of fabricating electronic devices incorporating electronic chips, such as diodes, have required the use of a thin gold wire which is ultrasonically bonded to the chip. This is generally a tedious two step manual operation with the wire first attached to the circuit and then to the chip. Because of this requirement, it has not been possible to fully automate the production of such devices or to fully utilize continuous flat etched and/or plated circuitry.

SUMMARY OF THE INVENTION

The present invention concerns an improved method of fabricating circuits incorporating electronic chips. At least one narrow lead for the chip is formed on a thin flexible, transparent insulating substrate by conventional etching or plating methods. The chip is positioned on the substrate in a face down position and bonded thereto by known means including solder reflow or conductive epoxy. A second lead is bonded to another contact point on the chip by similar means. The assembly can be encapsulated by means, such as a reflector and lens system, attached to opposite sides of the substrate. The subject narrow leads are preferably formed in strips and the associated circuitry can be formed on the same strip or on a secondary strip which is bonded to the lead strip.

It is an object of the present invention to teach an improved narrow lead formed on a transparent, flexible substrate of insulating material which lead is bonded to an electronic chip.

It is another object of the present invention to teach a method of face down bonding of electronic chips on narrow leads formed on a flat flexible film of transparent insulating material.

It is yet another object of the present invention to teach a method of bonding electronic chips to preformed narrow leads on continuous flat etched and/or plated circuitry, which method is suitable for fully automated production.

It is a further object of the present invention to produce a new and improved thin film circuitry having narrow leads adapted to receive electronic chips without obscuring the chip faces.

It is still a further object of the present invention to construct a new and improved light emitting diode assembly on thin film circuitry in which the light emitted from the back and sides of the diode is reflected through the film and passed out through a lens system with less than 35% of the emitting face of the diode being obscured by connecting leads.

It is another object of the present invention to construct new and improved electronic chip circuitry which may be readily and economically produced.

The foregoing and other objects and advantages will become apparent from the following specification and detailed description taken in conjunction with the accompanying drawings.

BRIEF DESCRIPTION OF THE DRAWINGS

FIG. 7 is an exploded perspective view showing a light emitting diode assembly formed in accordance with the present invention together with a strip of a thin film circuit, a base circuit, and mounting panel;

FIG. 8 is a detailed plan view of a thin film circuit which may be utilized to control the conductivity of an associated electronic chip;

DESCRIPTION OF THE PREFERRED EMBODIMENTS

The subject invention will be discussed primarily in conjunction with light emitting diodes. For this reason the insulating substrate is transparent and the encapsulating members are lenses and reflectors. However, it is to be understood that other types of electronic chips, including other types of diodes, may be bonded to the subject narrow lead, as will be explained with reference to FIG. 10.

Figure 1:
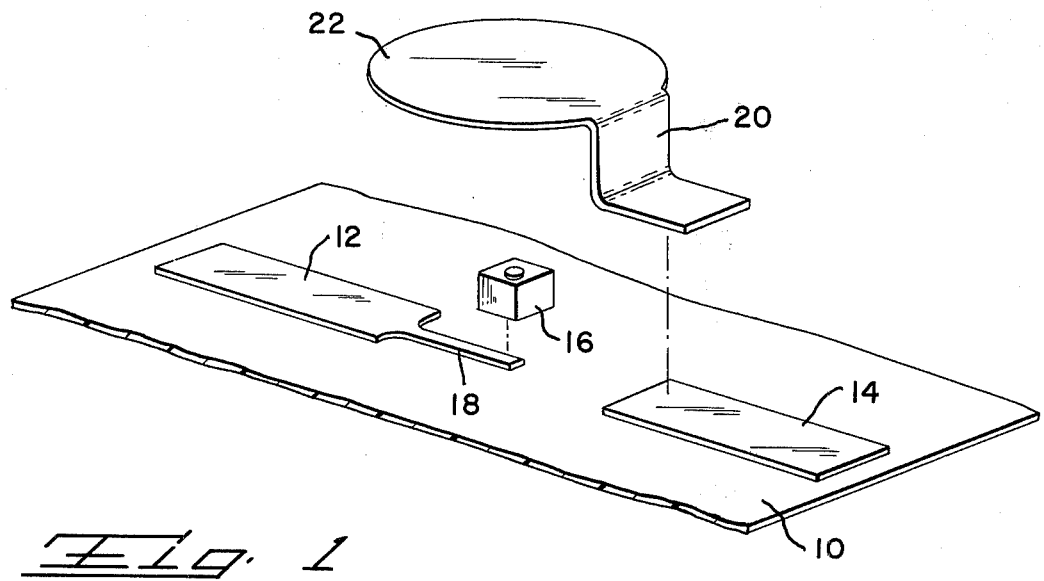
FIG. 1 is an exploded perspective view of a first embodiment of the subject invention together with a light emitting diode.
Figure 2:
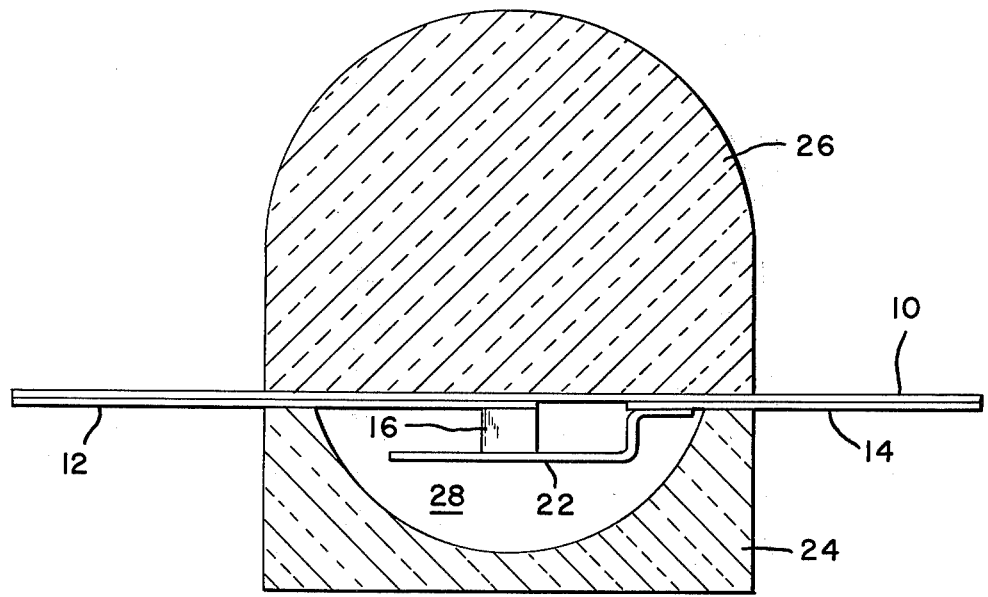
FIG. 2 is a vertical sectional view through the light emitting diode assembly of FIG. 1.

The first embodiment of the subject invention, see FIGS. 1 and 2, includes an insulating substrate 10, formed by a continuous flat flexible transparent film such as Mylar or Kapton, with circuitry 12, 14 etched or plated on one side of the substrate by any of the well known techniques. An electronic chip, such as light emitting diode 16, is placed with its face (the p-side or light emitting side) toward the substrate against a narrow lead 18 such that the emitted light will be directed out through the substrate. The narrow lead 18 preferably has such a width that it obscures no more than 35% of the face of the chip 16. A base lead 20 is placed between the back or n-side of the diode and the second lead 14 on the substrate. The leads are bonded to the diode by known means, such as conductive epoxy or solder reflow. The base lead 20, in this embodiment, has the form of a flat disc 22 with a diameter in the range of 5 to 10 times the diode dimensions and functions as a flat reflector. The assembled diode is encapsulated within backing member 24 and lens system 26 which are attached to opposite sides of the thin film in a conventional manner. The backing member 24 includes a cavity 28 to receive the diode assembly. The backing member and lens system may be selected from a wide range of plastics and glass materials.

Figure 3:
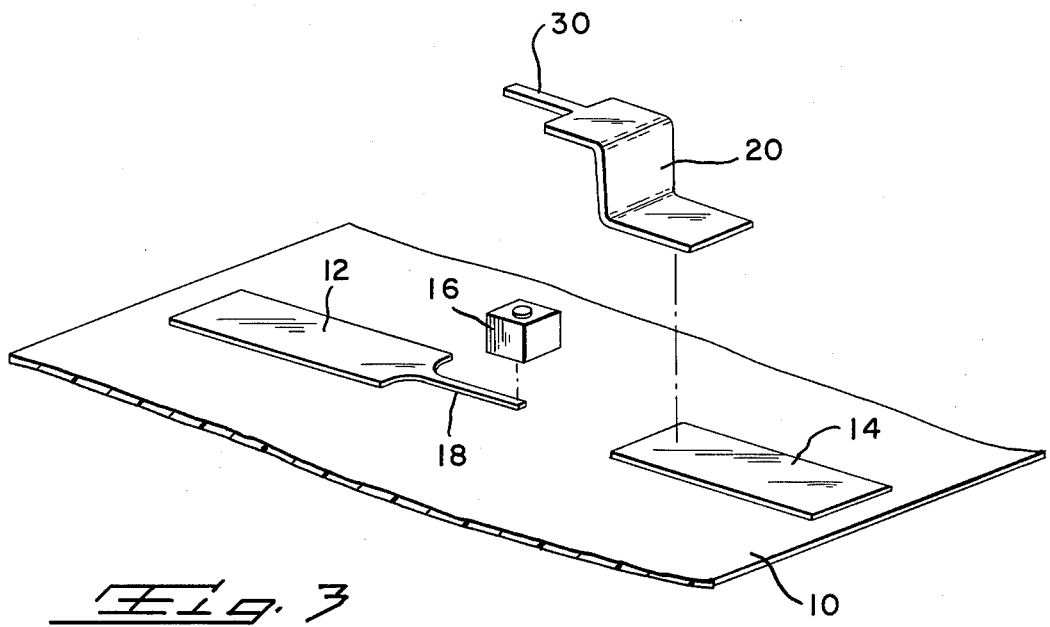
FIG. 3 is an exploded perspective view of a second embodiment of the subject invention and a light emitting diode.
Figure 4:
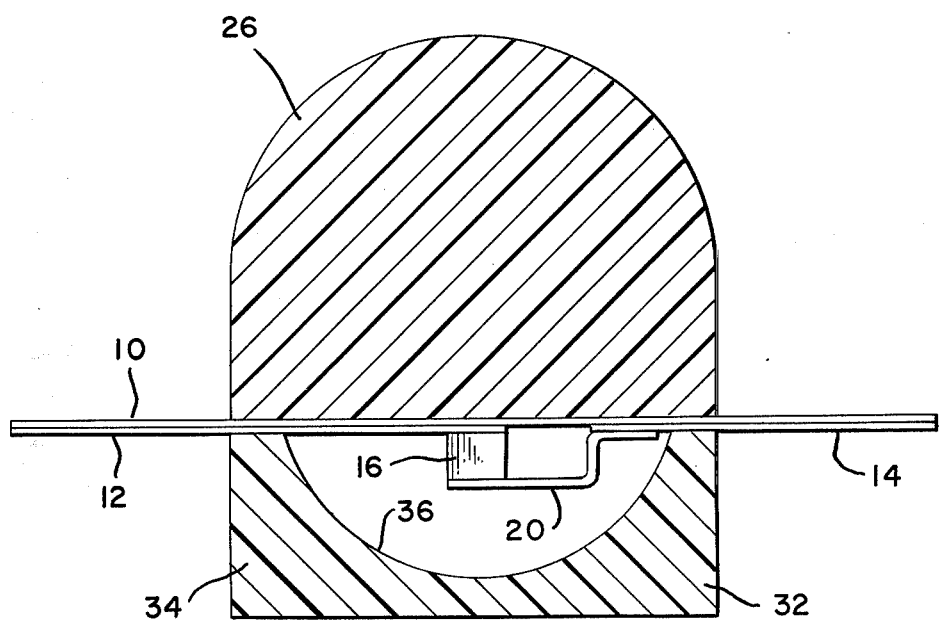
FIG. 4 is a vertical sectional view through the light emitting diode assembly of FIG. 3.

The second embodiment, FIGS. 3 and 4, differs from the first embodiment in that the base lead 20 includes a narrow lead element 30, without the disc shaped reflector, and the backing member 32 is a pre-molded semispherical reflector consisting of a short cylinder 34, made of epoxy resin loaded with MgO powder, with an axial semispherical depression 36 in one end of the cylinder. This backing member 32 is cemented over the diode assembly in conjunction with a pre-molded lens system 26 which is mounted on the side of the film opposite the diode. The MgO powder in the backing member pellet will function as a reflector for the back and side emitted light, directing it out through the flexible film 10 and the lens system 26.

Figure 5:
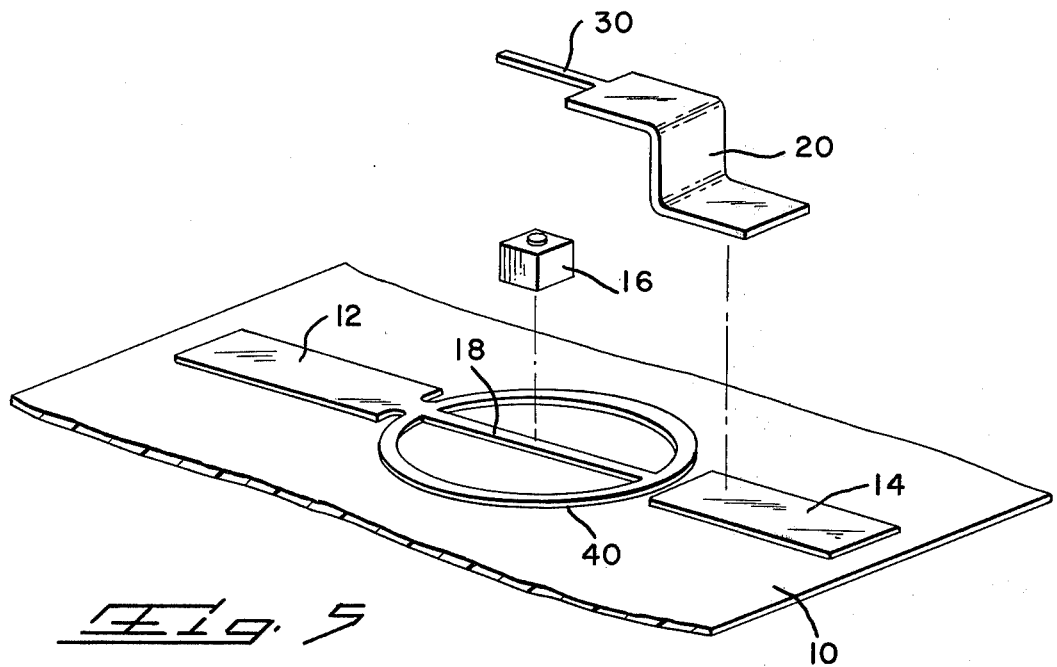
FIG. 5 is an exploded perspective view of a third embodiment of the subject invention and a light emitting diode.
Figure 6:
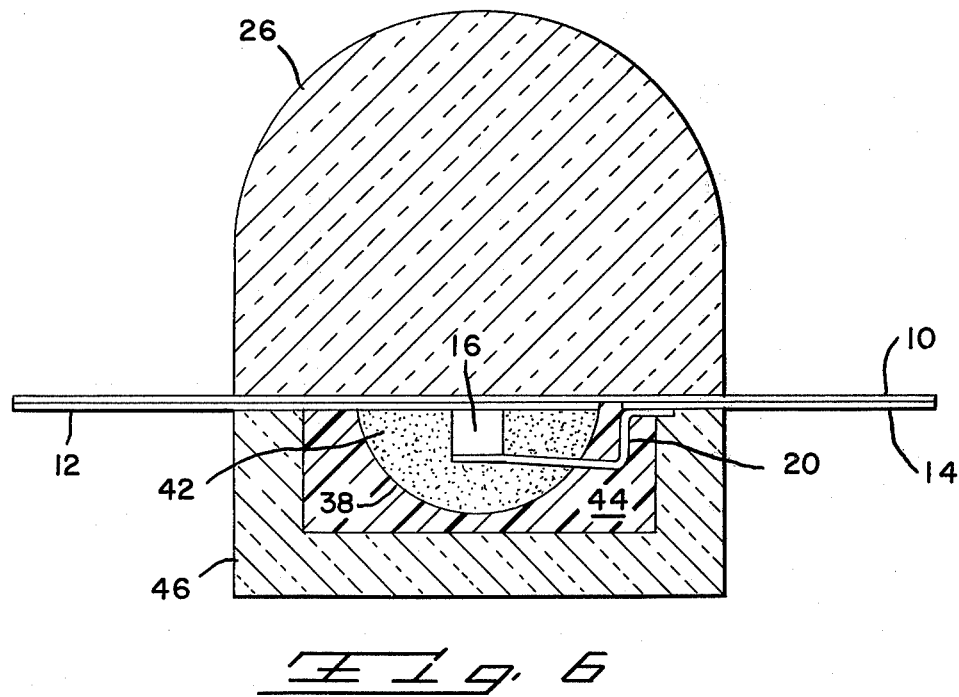
FIG. 6 is a vertical sectional view through the light emitting diode assembly of FIG. 5.

The third embodiment, FIGS. 5 and 6, includes a semispherical mirror 38 formed around the diode assembly. A circular ring 40 is plated or etched onto the thin film 10 along with leads 12, 14 and 18. The ring 40 surrounds the narrow lead 18 which lies along the diameter of the ring. A small drop of resin 42 is deposited over the diode assembly and its semispherical shape is maintained by the circular ring 40. After the drop of resin has been cured, the outer surface of the resin is formed into a reflecting surface by molding a cylindrical pellet 44 of MgO loaded resin over the semispherical surface. The entire assembly is then fully encapsulated in backing member 46 and lensing system 26.

The subject light emitting diode assemblies are preferably made in continuous strips according to any one of the above three embodiments. The strip can be cut by conventional means (not shown) in order to mount the diode assembly in an associated circuit.

FIG. 7 shows an exploded perspective view of a display device, such as an automotive diagnostic panel, incorporating light emitting diode assemblies formed in accordance with the subject invention. The panel 48 has a plurality of apertures 50 formed therein. A first level or base circuit 52 is constructed, for example, from copper laminated stock which is coated with photo resist, imaged, developed, etched and plated with solder, by conventional means, to form circuitry 54. The base circuit is positioned adjacent the rear of the display panel 48 with the circuit contacts exposed and with apertures 56 aligned with apertures 50.

A second level circuitry strip 58 is formed much in the same manner as the base level circuit. The second level circuitry may be primarily a resistance circuit which is adjustable, to some extent, simply by punching holes in the circuit, thereby controlling the intensity of the light emitted from the diode. Holes 60 are punched through the second level circuitry strip 58 so that when the diode assembly 62 is mounted thereon, either the lens or backing element can project therethrough. The terminals of the diode assembly 62 and the termination leads of the second level circuit 58 are solder plated in much the same way as the base circuit 54. The diode assembly 62, second level circuit 58 and base circuit 54 are placed together, with the soldered surfaces in register, and heat is applied to bond the assembly by solder reflow between the levels. Similar bonding can be accomplished through the use of conductive epoxy.

FIG. 8 shows a detail plan view of associated circuitry for use in connection with the subject invention. In this embodiment a fragment of a thin film insulator substrate 64, such as Mylar, is shown with a circuit formed thereon by printing or etching in a conventional manner. The circuit includes leads 66, 68, common bus 70, resistances 72, 74, 76, and shunts 78, 80. Two spaced arcuate apertures 82, 84 are punched in the film to separate resistance 72 from bus 70 and lead 66 from lead 68. The above discussed light emitting diode assembly is formed, according to this embodiment, by placing a diode 86 on the narrow lead extension 88 of lead 68 (with the emitting or p-side towards the film). A base lead 90 is placed on the back of the diode and the end 92 of the resistance 72. The diode assembly is then bonded together by known means, such as with conductive epoxy or solder reflow. The diode assembly is next encapsulated between a backing or reflector element and a lens system (neither of which is shown) in the same manner as the earlier described embodiments.

Registration holes 94 are formed in the thin film 64 at regular spaced intervals. These holes are preferably punched in the film prior to printing the circuitry thereon and are utilized during the entire process of forming and incorporating the subject invention into an assembly. The registration holes are first used during printing of the circuitry, then for punching the holes 82, 84, mounting diode 86, placing back lead 90, bonding and encapsulating the assembly.

The completed diode assembly can be adjusted for illumination intensity by energizing the diode and punching out shunts 78 and/or 80 as needed.

Figure 9:
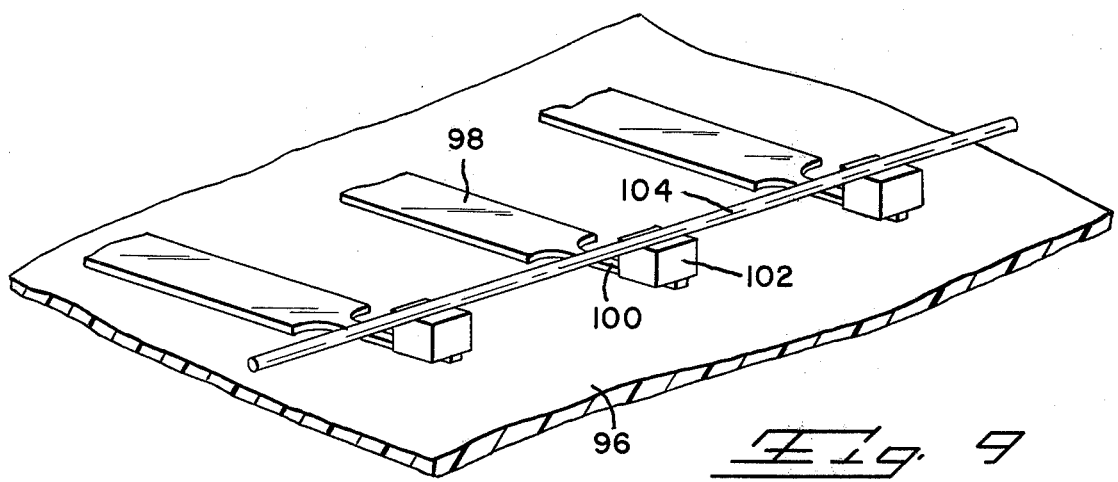
FIG. 9 is a perspective view of an alternate embodiment for bonding a back lead to a row of chips bonded to a row of narrow leads formed in accordance with the present invention.

FIG. 9 shows a perspective view of an insulator substrate 96 having a plurality of closely spaced conductors 98 printed thereon by conventional means. Each conductor 98 terminates in a narrow lead 100 in accordance with the present invention. An electronic chip 102, such as a light emitting diode, is mounted face down on the free end of each respective narrow lead. A single wire 104, such as a gold wire, is placed in common across the backs of all of the diodes 102 and the assembly is bonded together as previously discussed.

Figure 10:
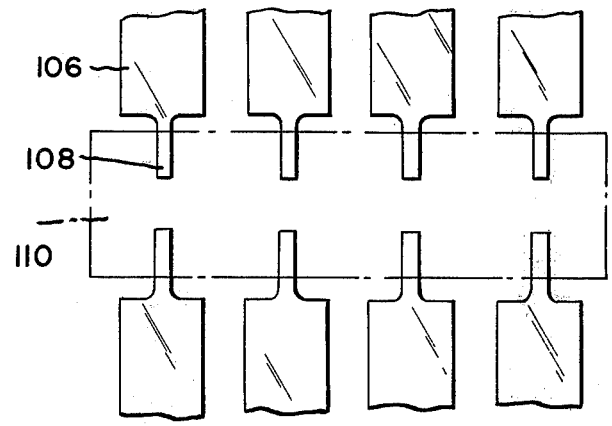
FIG. 10 is a perspective view showing the attachment of another type of electronic chip to a plurality of closely spaced, parallel leads formed according to the subject invention.

FIG. 10 relates to utilization of the subject narrow leads on a flexible substrate to other types of electronic chips. In this case a plurality of closely spaced, parallel, conductors 106 are printed on a thin film substrate with narrow leads 108 extending from the ends of the conductors. The electronic chip 110 is face down bonded to the leads by means such as with conductive epoxys or reflow solder. Each lead is positioned to engage a contact point on the chip.

The present invention has been described with reference to several specific embodiments. However, the present invention may be subject to many modifications and changes without departing from the spirit or essential characteristics of the invention. The embodiments set forth in the accompanying drawings and description should therefor be considered as being illustrative only.

We claim:
1. A method of fabricating light emitting diode assemblies comprising the steps of:
 forming an electrical circuit on a thin, flexible, transparent insulating substrate, said circuit including at least one chip attachment area defined by a first narrow conductive lead and forming an adjacent portion of said circuit spaced from said chip attachment area;

positioning a light emitting diode having metallic bonding pads on opposite sides thereof on said substrate, said pad on the light emitting face contacting said narrow lead;

placing a base lead in contact with the other pad of said chip and said adjacent portion of said circuit;

bonding said chip to said leads and said base lead to said adjacent portion of said circuit; and encapsulating said chip and leads.

2. The method according to claim 1 further comprising forming said electrical circuit to include at least two resistances and a shunt path bridging each said resistance, and selectively adjusting the conductivity of said light emitting diode by removing respective ones of said shunt paths.

3. The method according to claim 1 further including forming reflector means comprising a flat disc integral with said base lead, said disc lying adjacent one side of said chip.

4. The method according to claim 3 wherein said flat disc has a diameter in the range of 5 to 10 times the chip dimensions.

5. The method according to claim 1 further comprising forming said base lead as a narrow element;

forming a backing member from a short cylinder of epoxy resin loaded with MgO powder with a semispherical axial depression formed in one end thereof; and bonding said backing member to said substrate with said depression forming a reflector for said diode.

6. The method according to claim 1 further comprising providing reflector means by forming said first lead as a circular ring with a narrow lead extending diametrically thereacross;

depositing a drop of resin on said ring to be held in semispherical shape thereby; and molding a pellet of MgO loaded resin over said semispherical surface thereby forming a semispherical reflecting surface therebetween.

7. The method according to claim 1 said encapsulating comprising:

mounting reflector means on said substrate adjacent one side of said diode, and mounting lens means on the other side of said substrate opposite said diode.

* * * * *